United States Patent [19]
Schulman et al.

[11] Patent Number: 5,606,178
[45] Date of Patent: *Feb. 25, 1997

[54] BIPOLAR RESONANT TUNNELING TRANSISTOR

[75] Inventors: Joel N. Schulman, Agoura; David H. Chow, Newbury Park, both of Calif.

[73] Assignee: Hughes Electronics, Los Angeles, Calif.

[*] Notice: The term of this patent shall not extend beyond the expiration date of Pat. No. 5,489,786.

[21] Appl. No.: 477,683

[22] Filed: Jun. 7, 1995

[51] Int. Cl.$^6$ .................................................. H01L 29/06
[52] U.S. Cl. ............................. 257/25; 257/24; 257/197; 257/201; 257/615
[58] Field of Search ............................... 257/24, 25, 197, 257/201, 613, 615

[56] References Cited

U.S. PATENT DOCUMENTS 5,489,786  2/1996  Chow et al. .............................. 257/25

OTHER PUBLICATIONS

B. Jogal and K.L. Wang, "Dependence of tunneling current on structural variations of superlattice devices", *Applied Physics Letter*, vol. 46, 1985, pp. 167–168.

J.N. Schulman and M. Waldner, "Analysis of second level resonant tunneling diodes and transistors", *Journal of Applied Physics*, vol. 63, 1988, pp. 2859–2861.

M.A. Reed et al., "Realization of a three–terminal resonant tunneling device: The bipolar quantum resonant tunneling transistor", *Applied Physics Letter*, vol. 54, 1989, pp. 1034–1036.

*Primary Examiner*—Mark V. Prenty
*Attorney, Agent, or Firm*—Vijayalakshmi D. Duraiswamy; Wanda K. Denson-Low

[57] ABSTRACT

Base contacts are made to one or both barrier layers of a resonant tunneling bipolar transistor, rather than to the quantum well. This is made possible with the use of a type II rather than a type I energy band alignment in the active region.

22 Claims, 9 Drawing Sheets

BIPOLAR RESONANT TUNNELING TRANSISTOR

BACKGROUND OF THE INVENTION

1. Field of the Invention

The present invention relates to resonant tunneling devices, and more particularly to three terminal resonant tunneling transistors.

2. Description of the Related Art

A resonant tunneling device (RTD) typically has an active region with a double barrier structure for resonant tunneling of electrons. The double barrier structure includes a well region bounded on opposite sides by two barrier regions which contact the well region. Electrons are supplied to the active region by two electrode layers, one serving as an emitter and the other as a collector. The electrode layers are placed on opposite sides of the well region in contact with the barrier regions. The well region has at least one bound quantum energy state for electrons.

A resonant tunneling transistor (RTT) is an RTD with the addition of a control electrode, such as a base contact, which supplies voltage or current to the RTD's active region. Charge is added or removed from the quantum well region through the control electrode, changing the voltage differential across the barrier region. This modulates the bound energy states, which in turn controls the emitter-to-collector voltage at which tunneling occurs.

Figure 1:
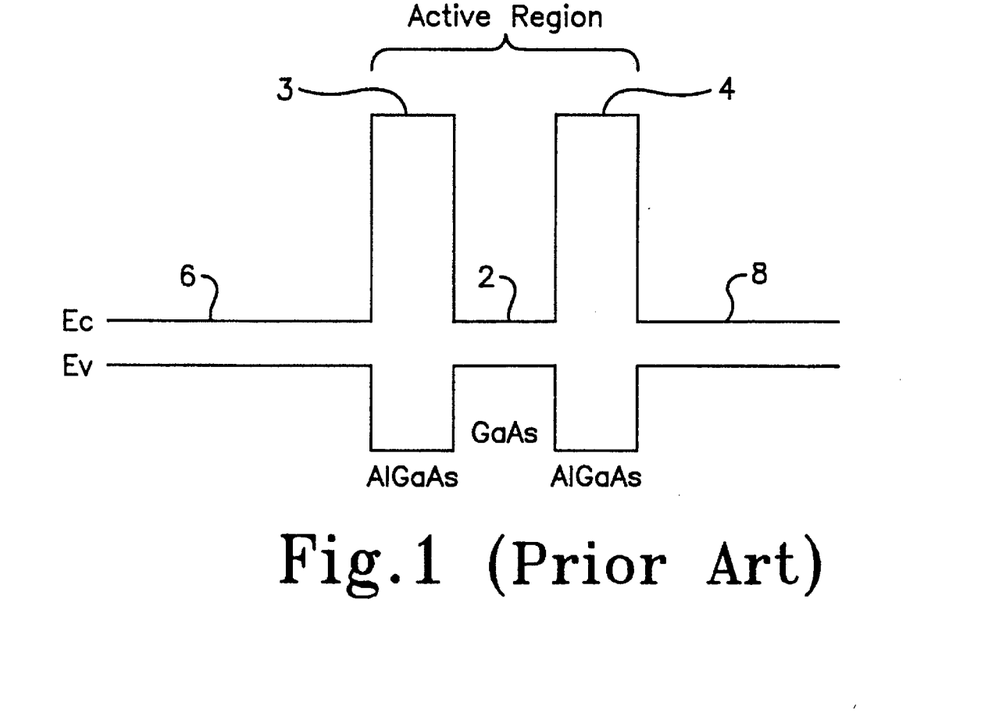
FIG. 1 is a schematic band edge diagram of an RTT with a type I band alignment active region.

FIG. 1 is an energy band diagram for one exemplary RTT structure described in B. Jogai and K. L. Wang, *Applied Physics Letter*, Vol. 46, Pages 167–168, (1985), which employs an active region consisting of a GaAs quantum well region 2 and AlGaAs barrier regions 3 and 4. The minimum conduction band energy level (Ec) and the maximum valence band energy level (Ev) are shown for this type I band alignment. Ec for the quantum well region 2 is less than Ec for AlGaAs barrier regions 3 and 4, while Ev for the well region 2 is greater than Ev for the barrier regions 3 and 4. Ec for GaAs emitter 6 and GaAs collector 8 regions on opposite sides of barriers 3 and 4 are approximately equal to one another and approximately at the same level as Ec for the well region 2.

In operation, electrons are provided by the emitter 6 and flow towards the first barrier region 3. To pass over this barrier the emitter 6 electrons must normally be at an energy above the barrier Ec. Resonant electron tunneling is a phenomenon in which the electrons can pass through the first barrier region 3 upon reaching the energy of a bound energy state in the well region 2 which is less than Ec of the first barrier region 3. Since the well region 2 is at a lower energy level than the barrier regions 3 and 4, the electrons that tunnel into the well region 2 accumulate there at an energy level above the well Ec. Conversely, holes flowing between the emitter 6 and the collector 8 accumulate in the well region 2 at an energy level below Ev. The well region 2 can therefore be a well for both holes or electrons.

A base contact (not shown) is made to the RTT's quantum well, injecting electrons (control electrons) into the quantum well to occupy bound energy states and manipulate the tunneling action. The problem with this base contact is that, if the barriers are thin enough to allow for tunneling of emitter electrons, the control electrons provided by the base also tunnel through the thin barriers. This results in a loss of control electrons from the well region, causing excessive base-to-collector leakage current as the base potential is increased, shorting the base-collector junction.

Another RTT structure is the quantum well excited state tunneling transistor (QuESTT). The QuESTT overcomes the problem of base leakage by lowering the Ec of the quantum well layer to narrow the band gap at the quantum well. As a result, the bound energy states in the quantum well are lowered and control electrons in the quantum well require greater energy to tunnel out. A greater number of control electrons are therefore available in the quantum well, potentially solving the problem of base leakage. The QuESTT is described in J. N. Schulman and M. Waldner, *Journal of Applied Physics*, Vol. 63, pages 2859–2861, (1988).

In operation, electrons are injected into the quantum well of the QuESTT from its base, modulating the bound energy states. By making the higher bound energy states equal to the emitter electron energy level, tunneling of emitter electrons can be controlled. However, attempts to fabricate an operational device have been unsuccessful because of difficulties in forming a contact to a thin quantum well base.

Another approach to creating an RTT, described in M. A. Reed et. al., *Applied Physics Letter*, Vol. 54, pages 1034–1036, (1989), uses a bipolar analog of the QuESTT. The active region of this device has a type I band alignment and consists of an InGaAs quantum well bounded by AlGaAs barriers, with GaAs collector and emitter regions. The base contact to the well is a heavily doped p-type semiconductor instead of the n-type base of the QuESTT, and the emitter and collector are n-type, creating a bipolar RTT. Since the base is p-type, holes instead of electrons are injected into the quantum well to control the current from the emitter. The addition of In to the quantum well lowers its Ec below the emitter Ec. This reduces the bandgap between Ec and Ev in the well, thus suppressing hole leakage from the well into the emitter.

A problem with this device is that a p-type current control is introduced to the quantum well region, where the densities of electrons and holes are high. The close proximity of electrons in the well's conduction band to the holes in its valance band attracts the electrons to the holes, scattering the electrons. Electron scattering reduces the device's maximum-to-minimum current ratio, diminishing its negative differential resistance (NDR). NDR is the current-to-voltage relationship of an RTT, characterized by a decrease in the emitter-to-collector current as the emitter-to-collector voltage is increased over a particular voltage range. NDR is desirable because maximum and minimum current levels are achieved, making the RTT functional as a switch or an oscillator.

SUMMARY OF THE INVENTION

This invention seeks to provide a novel and improved bipolar RTT having a better NDR and base stability over a larger emitter-to-collector biasing range than has been attained in the past. Unlike all of the prior RTTs in which the base contact was attempted to be made to the well, in this invention the base contact is made to at least one of the barriers and not the well. This is accomplished by choosing the semiconductor composition of the new RTT to produce a type II band alignment, with the well and barrier regions establishing wells for charges of opposite respective polarities.

In the preferred embodiment, the invention is implemented as an npn RTT, in which Ec and Ev for the well region are less than Ec and Ev for the two barrier regions respectively, and Ec for the barrier regions are approximately equal. Ev for the barrier regions are approximately equal and are between the Ev and Ec of the well region (but closer to its Ec). The Ec's for the emitter, collector and well are approximately equal, as are their Ev's. With this configuration, the density of the electrons flowing from the emitter to the collector is greater in the conduction band of the well region than in the conduction band of the barrier region. Conversely, the density of holes is greater in the valence band of the barrier region than in the valence band of the well region.

A base control terminal contacts at least one barrier region, creating a charge transfer junction for modulating the voltage differential across the contacted barrier(s). This moves the bound energy states in the well region up or down to control the emitter-collector voltage required for electron tunneling. To achieve a stable base contact, the barrier region Ev is made close enough to the well Ec to provide a pocket in the valence band of the barriers in which base holes can accumulate, yet far enough from the well Ec to limit electron scattering. This is done by controlling the material composition of the barriers.

In a preferred embodiment, electrode layers of highly doped n-type InAs, on opposite sides of but spaced from a quantum well region, serve as the RTT collector and emitter. The quantum well region is InAs, made thin enough to provide a clearly defined bound energy state for electron tunneling. First and second $Al_{1-x}Ga_xSb$ barrier layers are interposed between the emitter and the quantum well and between the collector and the quantum well, where x is in the approximate range of 0.4–0.6.

DETAILED DESCRIPTION OF THE INVENTION

The present invention is an RTT that achieves superior performance and manufacturability by making a base control contact to one or both of the RTT active region barriers, as opposed to existing RTTs which have a base contact to the well region. A base contact to the barriers is made possible through a semiconductor structure that produces a type II as opposed to a type I active region band alignment.

Figure 2:
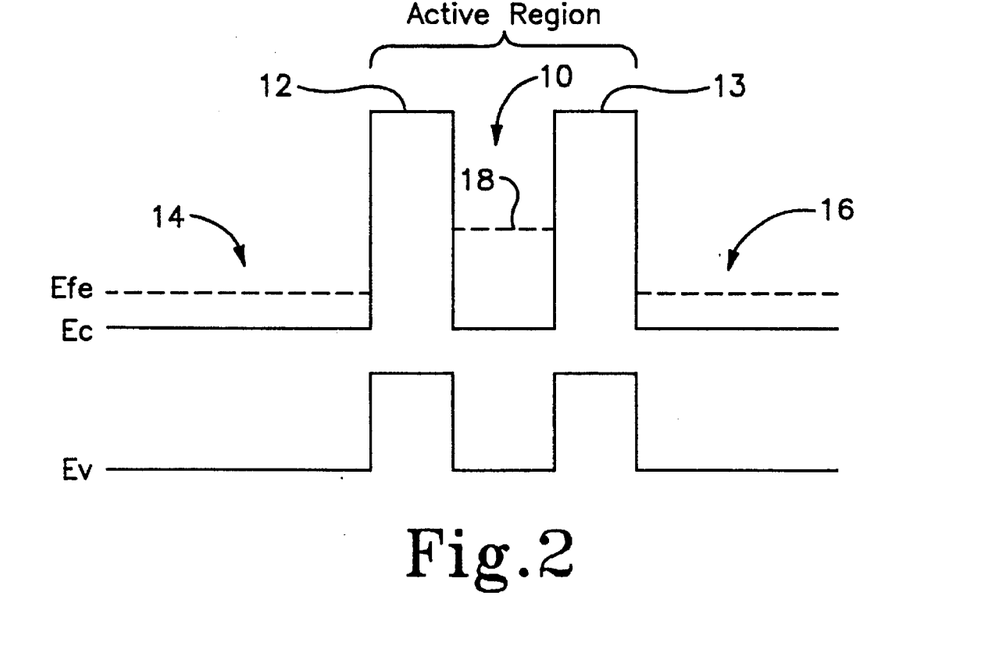
FIG. 2 is a schematic band edge diagram of the present invention's RTT with a type II band alignment active region.

FIG. 2 illustrates the type of band alignment used in a preferred implementation of the invention. In the active region, Ec and Ev for the well region 10 are respectively lower in energy than Ec and Ev for the barrier regions 12 and 13, while Ev and Ec for the two barrier regions are respectively approximately equal. Also, Ev for the barriers 12 and 13 are between Ev and Ec of the well region 10, but closer to the well's Ec. This provides a deep pocket in the valence band of the barriers for charges of positive polarity (holes) to accumulate in, allowing for a stable base contact to be made to there. Ecs of the emitter 14 and collector 16 are approximately equal and are at approximately the same level as Ec for the well region. Ev of the emitter 14 and collector 16 are also approximately equal and are at approximately the same level as Ev for the well region. This band alignment is a type II band alignment.

The electron path in the RTT is from the emitter 14 to the collector 16. The emitter 14 electron fermi level, Efe, is an energy level separating the emitter's empty energy states from its filled energy states at zero degrees Kelvin. Efe is the energy level at which there is a 50% probability that an energy state will be filled. For purposes of the invention, it may be assumed that a majority of electrons provided by the emitter 14 at the first barrier region 12 are concentrated at an energy between Ec and Efe. A small percentage of electrons are above Efe, some of which have enough energy to pass over the barriers 12 and 13, to reach the collector 16. This corresponds to a small current detected at the collector 16. However, the substantial majority of electrons do not have enough energy to pass over the barriers 12 and 13. Also, the lowest bound energy state 18 of the well region 10 is above Efe and therefore too high in energy for the electrons to tunnel through. If a low bias voltage is applied across the emitter 14 and collector 16, there is in an accumulation of emitter electrons (charges of negative polarity) in the space charge region of the emitter 14 near the first barrier region 12. However, there is still no electron tunneling.

Figure 3:
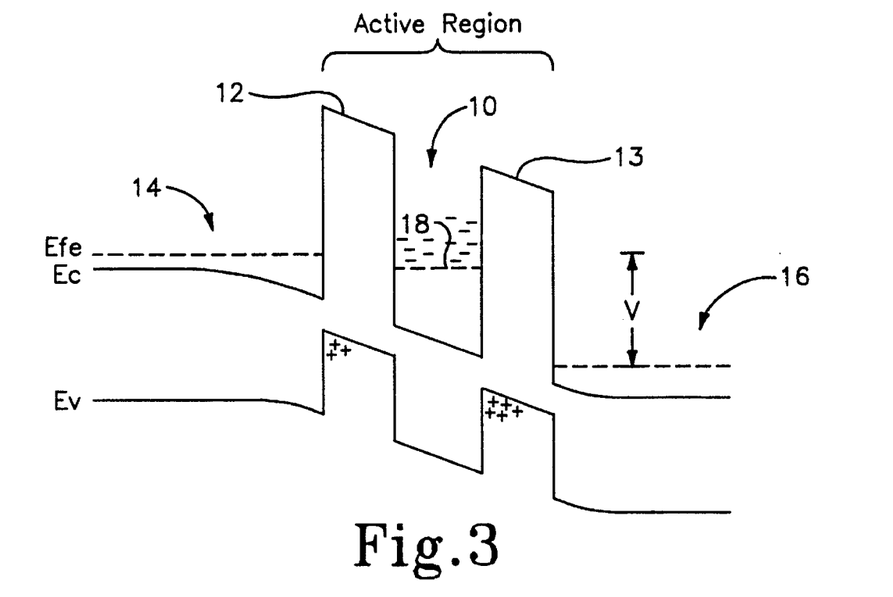
FIG. 3 is a schematic band edge diagram of the present RTT with a voltage applied across the active region.

FIG. 3 is the energy band diagram showing the effect on the FIG. 2 band alignment of applying a voltage V across the emitter 14 and collector 16. The voltage V raises the emitter 14 energy above that of the collector 16. This also raises Efe at the emitter 14 relative to the well's bound energy state 18. When a sufficiently high emitter-to-collector voltage is applied such that the emitter 14 Ec equals the bound energy state 18 (as shown in FIG. 3), the peak resonant tunneling voltage associated with that bound energy state is reached and electron tunneling is maximum. The result is a peak electron flow from the emitter 14 to the collector 16. However, if the emitter-to-collector voltage is increased beyond the peak resonant voltage, there is a sharp decline in the current from the emitter 14 to the collector 16. This is due to the emitter 14 Ec being greater than the lowest bound energy state 18, which prevents tunneling. In this case, assuming Efe is less than Ec of the first barrier region 12, few or no emitter electrons would be energetic enough to pass over the first barrier 12.

A control terminal in the form of a base contact is made to at least one of the barrier regions to create a charge transfer junction that controls the emitter-to-collector electron flow. The conductivity of the control terminal is opposite to that of the emitter and collector, thus forming a bipolar RTT. The control terminal is shown in FIGS. 5a–5c and 6a–6c, described below. By making the control terminal to the barrier(s) as opposed to the well, the transfer of charges is made to the barriers and away from the well where tunneling electrons concentrate. This reduces the effect of well electron scattering as observed with RTTs having a base contact at the well.

In operation, the transfer of charge between the control terminal and the barriers 12 and 13 changes the voltage differential across the barriers, which in turn alters the emitter 14 Ec level relative to the well region 10 Ec and its bound energy state 18. This influences the emitter-to-collector voltage required to reach the peak current flow (i.e., the voltage required to make the emitter Ec equal to the bound energy state 18). For example, if a p-type base contact is made to the first barrier region 12 of an npn RTT, holes can be injected into the base by applying a positive base voltage. This adds positive charge to the first barrier 12. Assuming the emitter-to-collector voltage is constant, the added holes in the first barrier 12 will increase the emitter-to-base voltage differential and decrease the base-to-collector voltage differential. The increased emitter-to-base voltage differential increases the emitter Ec closer to the bound energy state 18, requiring a lower emitter-to-collector voltage to reach the peak resonant voltage. If on the other hand, holes are drawn from the first barrier 12 by the base, the opposite effect takes place and a greater emitter-to-collector voltage is required to reach the peak resonant voltage.

Instead of or in addition to controlling a flow of holes into the first barrier 12 to raise or lower the emitter Ec relative to the well Ec, a base contact can be made to the second barrier 13 to provide a controlled hole flow into that region. For example, if a positive base voltage is applied to increase the hole concentration in the second barrier region 13, the potential drop across the collector 16 decreases, increasing the emitter 14 Ec relative to the Ec of the second barrier region 13. Emitter electrons are thus closer to the bound energy state 18 and a lower over-all emitter-to-collector voltage is required to achieve resonant tunneling; the opposite effect follows if holes are drawn from the second barrier 13. By making base contacts to both barriers at the same time, hole transfer can be made to both barriers, providing greater control over the emitter-to-collector voltage required for maximum electron tunneling than when only one base contact is made.

It can be seen in FIG. 3 that Ev of the barrier regions are between the Ec and Ev of the well region 10, but closer to the well Ec. This is accomplished by establishing a proper Al:Ga ratio in the barrier regions, as discussed below in connection with the RTT fabrication. A pocket is thus created in the barriers' Evs in which the base holes injected into the barriers accumulate. The plus symbols under Ev for the first and second barrier regions 12 and 13 in FIG. 3, indicate the accumulation of holes. The barrier Evs cannot be too close to the well Ec or holes will leak out to the collector and short the base-collector junction. However, if the barrier Evs are too low, there will not be a large enough pocket for holes to accumulate in the barrier valance bands, resulting in an ineffective base contact which does-not modulate the bound energy states in the well region 10. It is therefore necessary to establish Ev for the barriers 12 and 13 so that holes can accumulate there and remain stable.

The band alignment shown in FIGS. 2 and 3 results in the hole density being greatest in the barrier regions. This prevents scattering of the tunneling electrons in the well.

Figure 4:
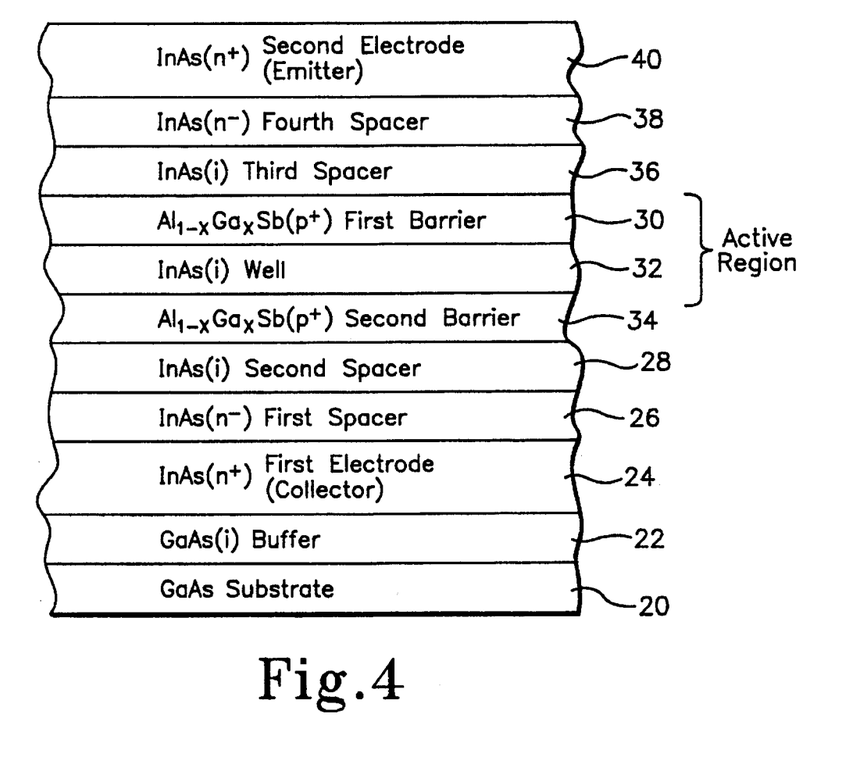
FIG. 4 is a sectional view of an RTT which is formed in accordance with the invention prior to the establishment of base, emitter and collector contacts.

FIG. 4 shows a preferred semiconductor structure that can be used to implement the invention prior to the formation of base, emitter and collector contacts. The various layers are preferably grown epitaxially by molecular beam epitaxy or metal organic chemical vapor deposition. Beginning with a GaAs semi-insulating substrate 20, an undoped GaAs buffer layer 22 is grown to a thickness of approximately 0.1 micrometer. An InAs first electrode layer 24, highly doped within the approximate range of $1\times10^{18}$–$1\times10^{19}$ cm$^{-3}$ with silicon, is grown on the buffer layer 22 to a thickness within the approximate range of 0.5–2.0 micrometers, preferably about 1.0 micrometers. The first electrode layer 24 is the RTT's collector, receiving electrons flowing through the active region.

A lightly n-doped InAs spacer layer 26 is grown on the collector 24, followed by an intrinsic second spacer layer 28, to prevent dopants from the collector 24 leaking into the active region and degrading the device's performance. The doping levels of the spacer layers 26 and 28 are low enough to permit charge transport between the highly doped collector 24 and the active region without contaminating the active region with unwanted charges. The spacer layers should also be thick enough to prevent the development of a large capacitance, but not so thick that they produce an undesireably high voltage drop. The first spacer layer 26 is doped with silicon within the approximate range of $2\times10^{16}$–$5\times10^{17}$ cm$^{-3}$, and preferably about $1\times10^{17}$ cm$^{-3}$, with a thickness of approximately 500 Angstroms. The second spacer layer 28 is preferably undoped, with a thickness of approximately 100 Angstroms.

The active region consists of first and second barrier layers 30 and 34, respectively positioned on opposite sides of a quantum well layer 32 with barrier 34 adjacent to the spacer layer 28. The barrier layers 34 are preferably $Al_{1-x}Ga_xSb$, doped p-type with a beryllium dopant concentration of about $1\times10^{18}$ cm$^{-3}$. This allows a p-type base contact to be made to either or both barriers to form an npn RTT.

The barrier layers are thin enough to limit their resistance to tunneling electrons, but thick enough to have reasonably large current and voltage breakdown levels. The preferred thickness for each is approximately 10–100 Angstroms.

Increasing x in the $Al_{1-x}Ga_xSb$ alloy increases Ev in the barrier layers. Making x too small results in a larger gap between the barriers Ev and the well Ec than is desired, leaving a pocket that is too small to accumulate holes from the base contact. 0.4–0.6 is the preferred range for x.

The well layer 32 is preferably undoped InAs with a thickness in the range of 20–150 Angstroms. Increasing the well thickness increases the scattering rate of tunneling electrons and lowers the well bound energy states, thereby reducing the peak resonant tunneling voltage for each bound state. A preferred width is 75 Angstroms, which provides at least one clearly defined bound energy state, well separated in energy from the next higher bound energy state. The lowest bound energy state thus provides at least one clearly defined peak resonant tunneling voltage which results in a clearly defined high and low emitter-to-collector current levels. This is desirable for digital applications.

Third and fourth spacer layers 36 and 38 that preferably have the same respective compositions, thickness and doping levels as spacer layers 28 and 26 are formed sequentially on the first barrier 30, followed by and emitter electrode layer 40 with preferably the same composition and doping as the collector 24. However, the emitter 40 is preferably about 500–2000 Angstroms thick, which is approximately 10 times thinner than the collector 24. This is because thicker layers provide better contact surfaces for growing the initial layers of the RTT on one another.

Figure 5A:
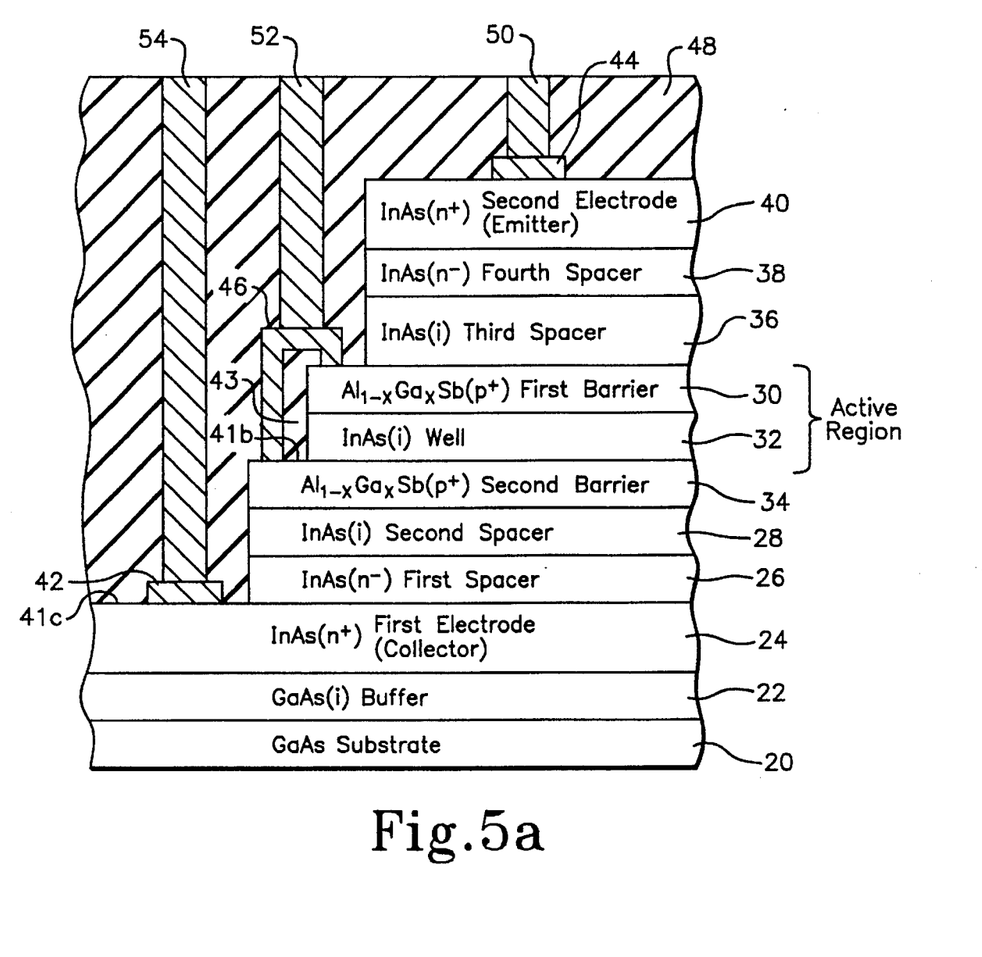
FIGS. 5a–5c are sectional views of three embodiments of the present invention.

A preferred embodiment of the RTT is shown in FIG. 5a, in which base contacts are made to both of the barrier layers 30 and 34. It is fabricated by a sequence of selective etches that expose steps 41a, 41b and 41c on lateral portions of the upper surfaces of the first barrier 30, the second barrier 34 and the collector 24, respectively. A selective chemical etch of InAs material from the emitter 40 is first made down to the first barrier 30 to expose step 41a. Step 41b is then exposed by selective etches of the overlying material in the AlGaSb first barrier 30 and the InAs well 32. The portions of the AlGaSb second barrier 34 and the InAs first and second spacer layers 26 and 28 that overlie step 41c are then removed with appropriate etchants. Metal collector and emitter contacts, 42 and 44 are then formed on the collector and emitter electrodes 24 and 40, respectively. A continuous insulating layer 43 is then formed over a portion of steps 41a and 41b. A metal base contact 46 is then formed over the insulating layer 43 to contact both the first and second barriers 30 and 34. Through the base contact, holes are supplied or drawn from the barriers to change the voltage differential across them. The emitter, base and collector contacts 44, 46 and 42 are made of an ohmic metal such as Ti, Au or Pt.

Following the formation of metal contacts, a planarizing dielectric 48 is deposited over the RTT. Vias 50, 52 and 54 are then etched through the dielectric 48 down to the emitter, base and collector contacts 44, 46 and 42, respectively. The vias are then filled with interconnect metalizations to provide electrical access to the emitter, base and collector contacts 44, 46 and 42, respectively, from the upper surface of the dielectric 48.

Figure 5B:
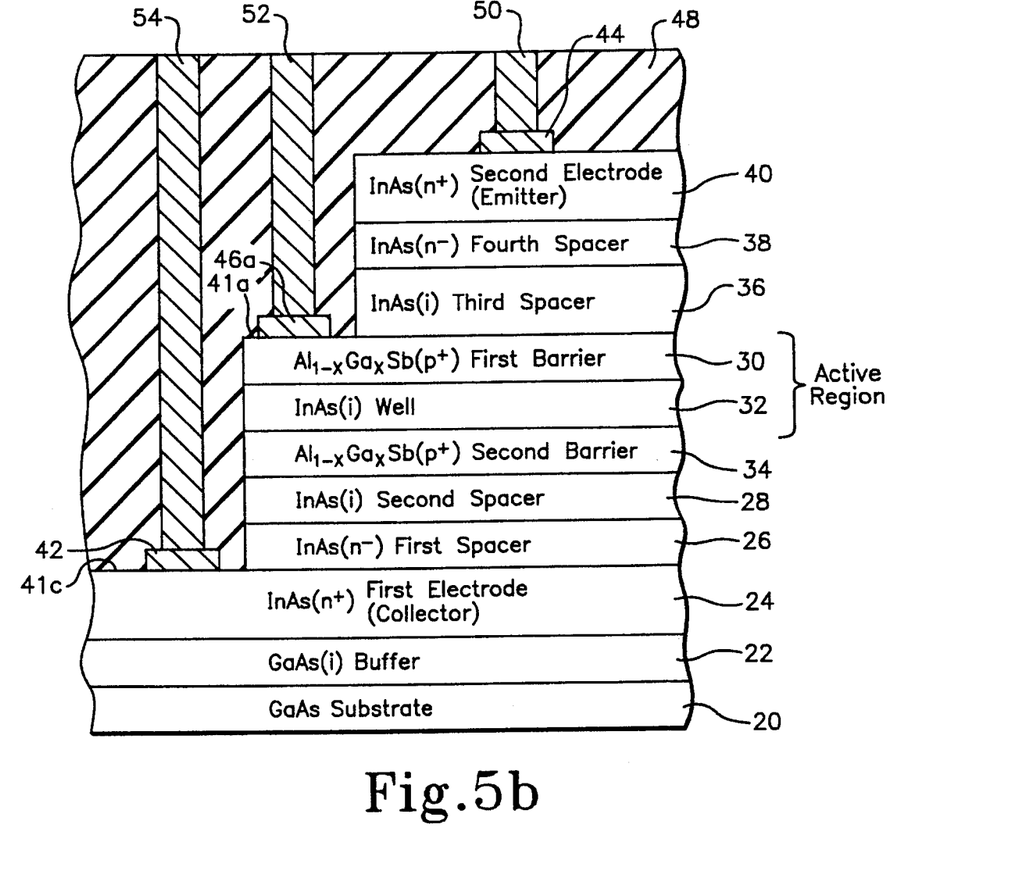

FIG. 5b shows another embodiment of the RTT in which the base contact 46a is made to only the first barrier 30. This is done by etching the layered structure to expose only steps 41a and 41c on the first barrier 30 and the collector 24, and eliminating step 41b on the second barrier 34. The steps are exposed and the contacts established in a manner similar to that described above for FIG. 5a.

Figure 5C:
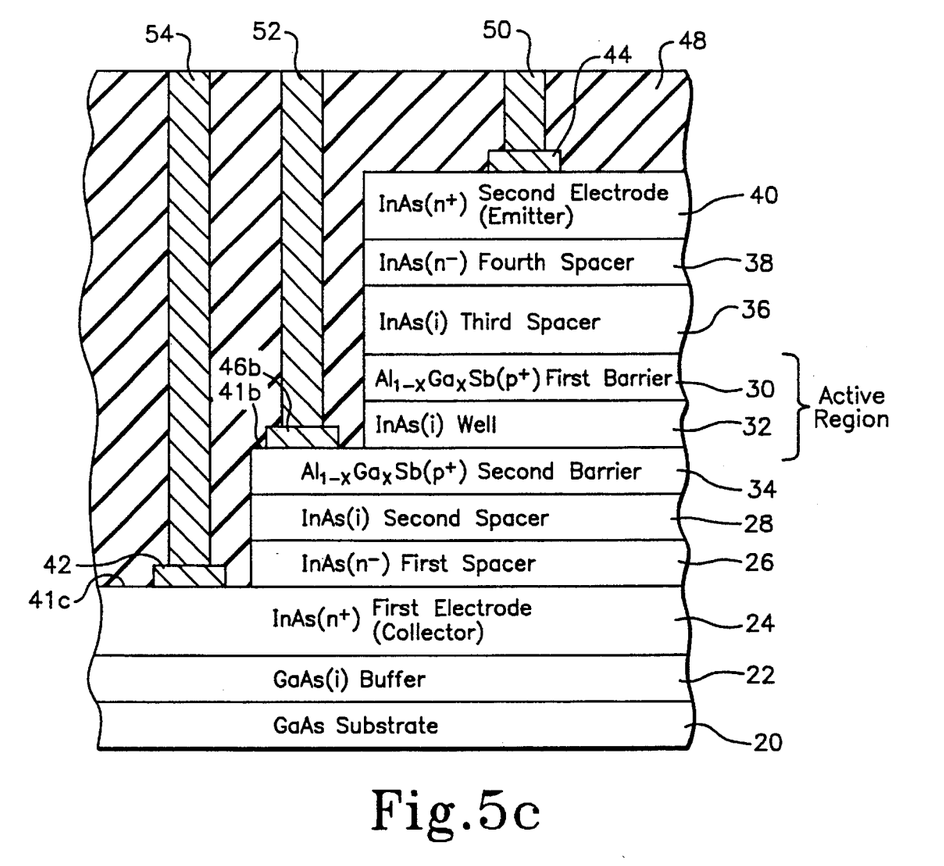

A third embodiment is shown in FIG. 5c, in which a base contact 46b is made to only the second barrier 34 on step 41b. Again, the steps 41b and 41c are exposed and the contacts are established in a manner similar to FIG. 5a.

Figure 6A:
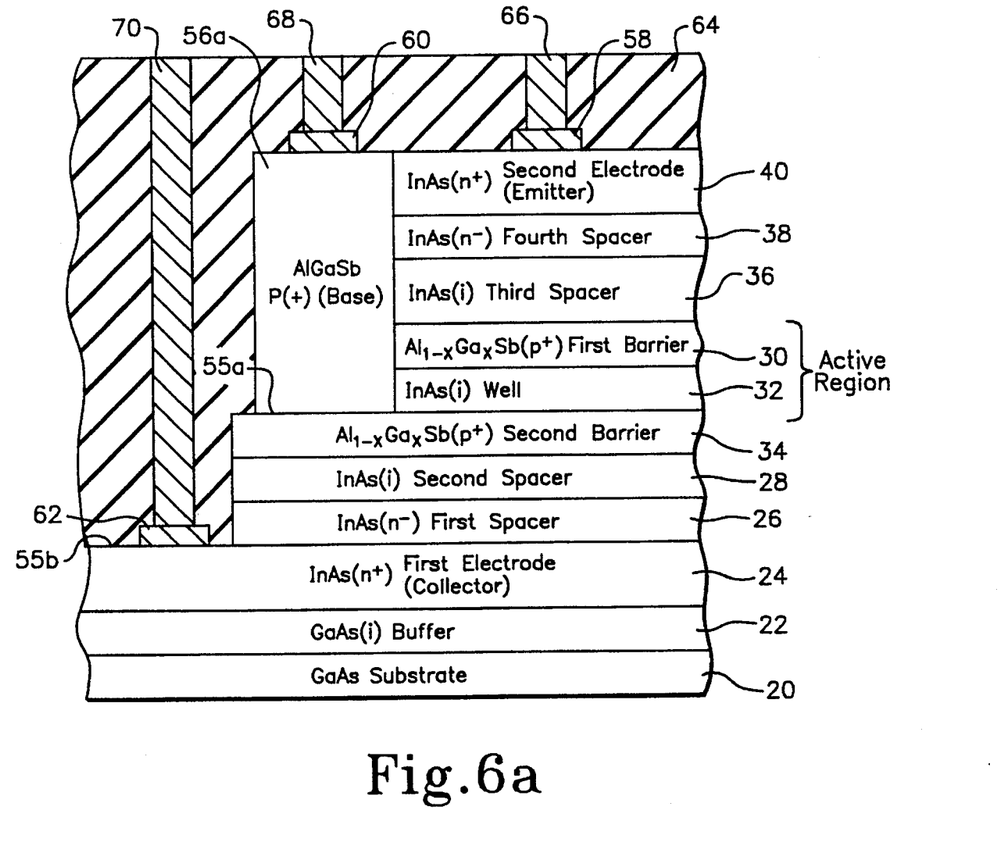
FIGS. 6a–6c are sectional views of three alternate embodiments of the invention.
Figure 6B:
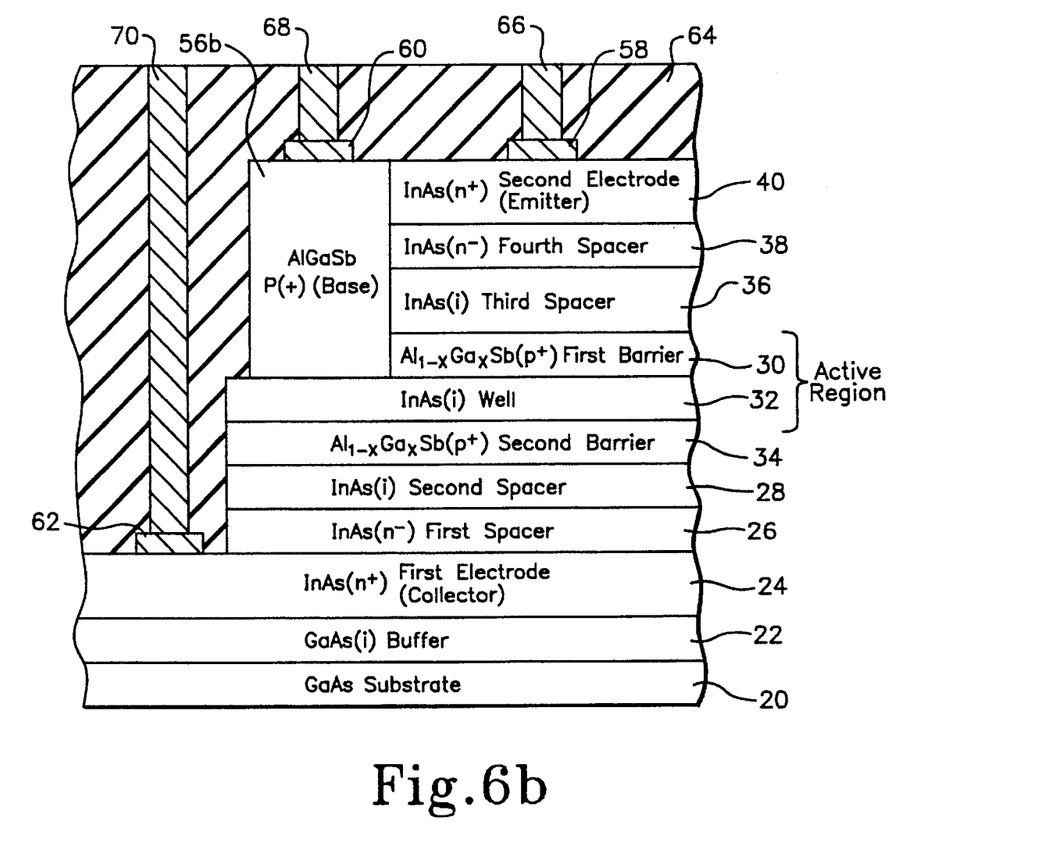
Figure 6C:
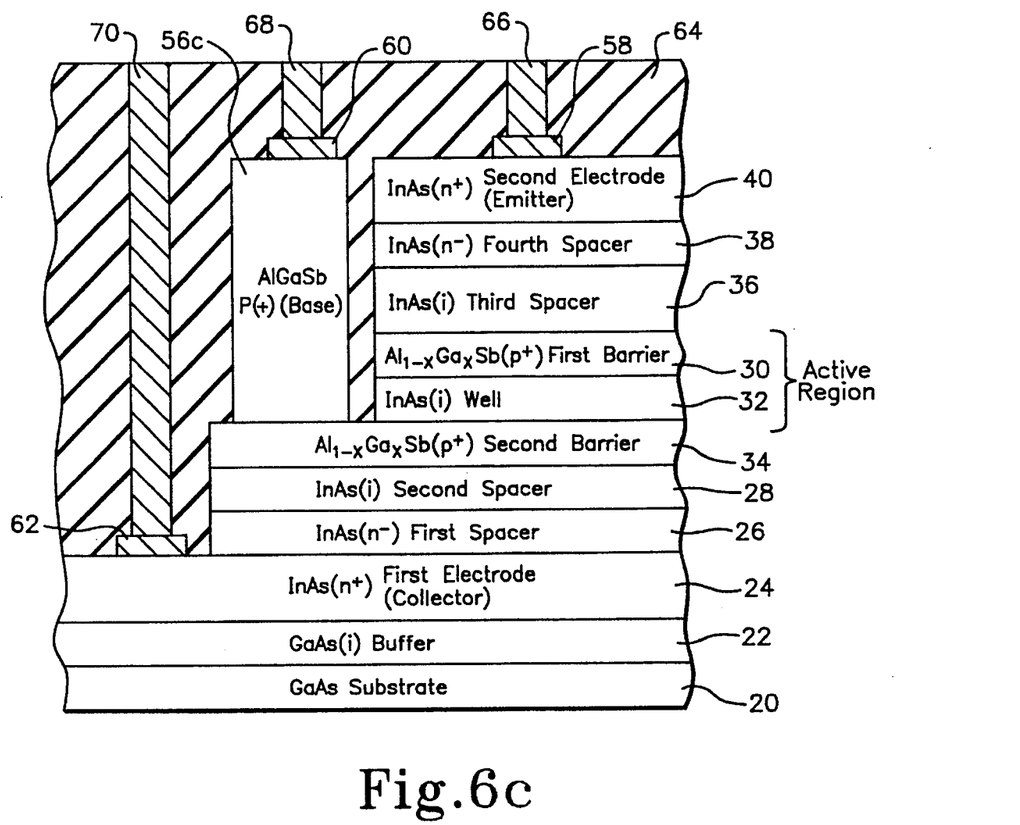

FIGS. 6a, 6b and 6c show a second set of embodiments in which the base contacts are made to one or both of the barrier layers through a heavily doped AlGaSb contact structure. In FIG. 6a the base contact is made to both barriers 30 and 34. Lateral steps 55a and 55b are formed on the upper surfaces of the second barrier 34 and the collector layer 24, respectively by selective etching. The step 55a on the second barrier 34 functions as a base platform upon which an AlGaSb base extension 56a, doped p-type preferably in the range of about $1 \times 10^{18}$ cm$^{-3}$ with beryllium, is epitaxially grown. The base extension 56a contacts both the steps 55a on the second barriers 34 and the lateral edge of the first barrier 30. Since the base extension 56a is of the same chemical composition and approximate doping as the first and second barriers charge transfer occurs only across the junctions between these elements, and not across the junctions between the base extension 56a and the well 30, third and fourth spacers 36 and 38 or emitter 40. Once the base extension 56a has been formed, metal emitter, base and collector contacts 58, 60 and 62 are formed on the emitter 40 and steps 55a and 55b, respectively. The planarizing dielectric 64 is then deposited over the RTT. Vias 66, 68 and 70 are etched through the dielectric 64 to the emitter, base and collector contacts 58, 60 and 62, respectively, and filled with metal to provide electrical access to the emitter, base and collector contacts from the dielectric 64 surface.

In FIG. 6b an AlGaSb base extension 56b extends only to the first barrier 30 to provide an RTT analogous to that shown in FIG. 5b. In FIG. 6c, which corresponds to FIG. 5c, the base extension 56c contacts only the second barrier 34. It is laterally spaced from the layers above the second barrier 34 by a vertical strip of the dielectric 64.

Figure 7:
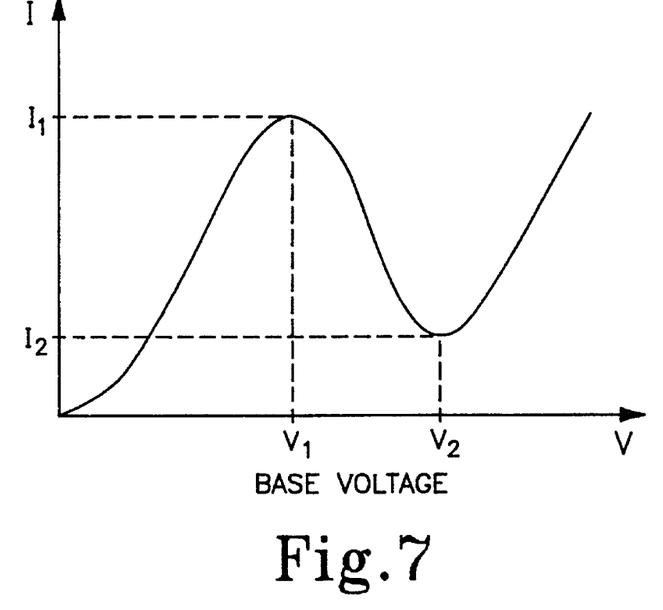
FIG. 7 is an I–V plot illustrating the NDR achieved by the invention.

FIG. 7 is a current-voltage plot illustrating the NDR output produced by the described RTT. For this NDR output the first and second barrier layers 30 and 34, are $Al_{0.5}Ga_{0.5}Sb$, each approximately in the range of 24–30 Angstroms thick, preferably 27 Angstroms. To plot this curve, an emitter-collector bias voltage was applied and the current through the RTT measured. As the bias voltage initially increases from zero, the current also increases due to a greater number of electrons having enough energy to pass through the lowest bound energy state. When the emitter Ec becomes equal in energy with the lowest bound energy state of the quantum well, there is maximum electron tunneling through the quantum well. Maximum tunneling occurs at V1, the peak resonance voltage, at which the maximum current I1 is detected. As the voltage is increased above the peak resonant voltage, the emitter Ec increases above the bound energy state in the quantum well region and there is a sharp decline in the current through the device. The current drops to a minimum value I2 at voltage V2. I1 and I2 respectively correspond to high and low current states. The base voltage controls both the peak resonant voltage V1 and V2. For voltages greater than V2, the current increases as more emitter electrons have energy to pass through higher bound energy states or over the barriers. The curve shown in FIG. 7 shows I–V curve for electron tunneling through only the lowest bound energy state. If the voltage axis was extended in the positive direction, more peak current levels would be shown corresponding to maximum resonant tunneling through bound energy states higher than the lowest bound energy state.

Figure 8:
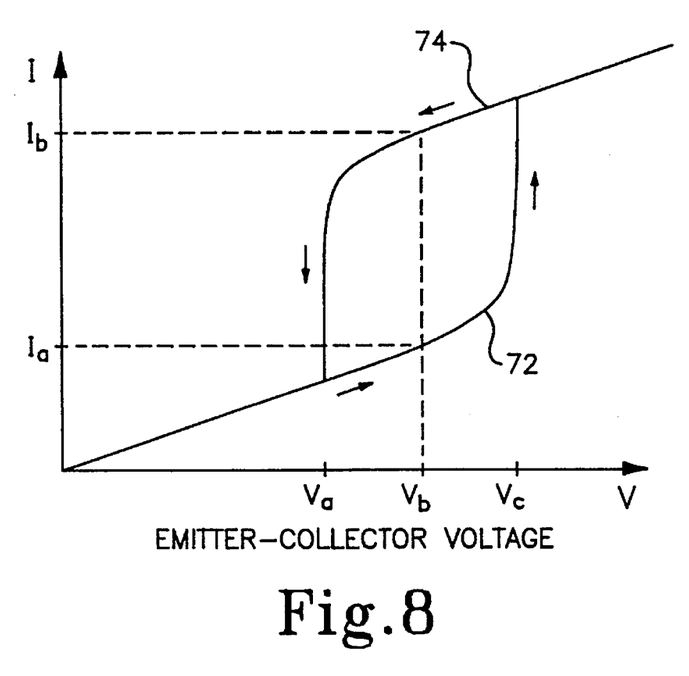
FIG. 8 is a voltage sweep I–V hysteresis curve illustrating dual state current levels achieved by the invention.

FIG. 8 is a room temperature voltage sweep I–V curve for the RTT with symmetric 18 Angstrom-thick $Al_{0.5}Ga_{0.5}Sb$ ordered alloy (alternating monolayers of AlSb and GaSb) barriers. The curve is plotted by measuring the current in the device while sweeping the emitter-collector voltage from zero up to 750 mV and then back down to zero. As the voltage is increased through levels Va and Vb to Vc, the current increases at a moderate rate along trace 72 until Vc is reached, at which point there is a sharp increase in current. This is due to the tunneling of holes from the second to barrier 13 to the first barrier 12. Tunneling of holes occurs at Vc because the heavy hole energy states in the second barrier 13 align with its light hole energy states. The hole alignment in the second barrier 13 creates a voltage differential across both first and second barriers 12 and 13 which results in increased electron tunneling through the bound energy state. Electron tunneling creates the sharp increase in the current through the RTT at Vc. For voltages above Vc up to 750 mV, there is a continuous increase in the current because of an increased number of emitter electrons tunneling.

When the voltage is dropped back down to Vc, the current follows a higher trace 74 before dropping back to the rising trace 72 at Va. This is due to the high hole concentration in the first barrier 12. For voltages between Va and Vc, such as Vb, current bistability is observed with the current being either Ia or Ib depending upon the voltage sweep direction. If the voltage is being swept down, the current at Vb is Ib, while if the voltage is being swept up, the current at Vb is a lower value Ia. This I–V behavior has also been observed in RTT samples with symmetric 21 Angstrom thick $Al_{0.4}Ga_{0.6}Sb$ barriers, 15 Angstrom thick $Al_{0.6}Ga_{0.4}Sb$ barriers and 18 Angstrom thick $Al_{0.5}Ga_{0.5}Sb$ barriers.

The role of the base extension in controlling I–V behavior is to change the hole distribution in the barrier regions and consequently change the voltage differential in the active region. This affects the voltage at which the hole distribution moves between the first and second barriers 12 and 13.

While particular embodiments of the invention have been shown and described, numerous variations and alternative embodiments will occur to those skilled in the art. For example, the first and second electrode layers 24 and 40 in FIG. 4 can be interchanged to serve as the collector and the emitter, respectively. Furthermore, the composition of the barriers can be changed from AlGaSb to InAs and the composition of the well, emitter and collector layers changed from InAs to AlGaSb to invert the band alignment shown in FIG. 2. This produces a pnp RTT with the Ec and Ev for the barriers lower than the Ecs and Evs for the well, emitter and collector regions, respectively. The well region thus becomes a well for holes and the barriers become a well for electrons. The flow of holes and electrons in the npn RTT as described in FIGS. 2 and 3 is reversed for the pnp RTT. In the pnp RTT, holes flow between the emitter and collector and accumulate in the well region while electrons are transferred between an InAs base extension and the barriers where they accumulate to control the current in the device. The fabrication methods for the pnp and npn RTTs are similar except that the base extension in the pnp RTT is InAs. Accordingly, the invention is intended to be limited only in terms of the appended claims.

We claim:

1. In a resonant tunneling transistor (RTT) including a quantum well region (well region), two barrier regions and two electrodes, the improvement comprising:

a type II energy band alignment for said barrier and well regions in which the minimum conduction band energy levels (Ecs) and the-maximum valance band energy levels (Evs) of said well and barrier regions establish wells for charges of opposite polarities in said well and barrier regions, respectively, and a controller contacting at least one of said barrier regions to create a charge transfer junction with each contacted barrier region that controls the flow of current between said electrodes.

2. An RTT as in claim 1, wherein the Ec and Ev of said well region are respectively lower than the Ec and Ev of said barrier regions, and the Ev of said barrier regions is lower than the Ec of said well region.

3. An RTT as in claim 2, wherein the Ev of said barrier regions is closer in energy to the Ec than to the Ev of said well region to allow for the accumulation of holes in said barrier regions.

4. An RTT as in claim 2, wherein the Ec and Ev of said electrodes are approximately equal to the Ec and Ev of said well region, respectively.

5. An RTT as in claim 1, wherein said barrier regions comprise $Al_{1-x}Ga_xSb$ with a thickness in the approximate range of 10–100 Angstroms.

6. An RTT as in claim 5, wherein X is in the approximate range of 0.4–0.6.

7. An RTT as in claim 1, wherein said well region comprises InAs with a thickness in the approximate range of 20–150 Angstroms.

8. An RTT as in claim 1, wherein said controller contacts only one of said barrier regions.

9. An RTT as in claim 1, wherein said controller contacts both of said barrier regions.

10. An RTT as in claim 1, wherein said controller comprises an extension of at least one of said barrier regions.

11. An RTT as in claim 1, wherein said type II energy band alignment establishes said barrier regions as electron wells and said well region as a hole well.

12. An RTT as in claim 1, wherein said type II energy band alignment establishes said barrier regions as hole wells and said well region as an electron well.

13. A resonant tunneling transistor (RTT), comprising:

first and second electrode layers having approximately equal minimum conduction band energy levels (Ecs) and approximately equal maximum valence band energy levels (Evs), a quantum well layer between but spaced from said first and second electrode layers, said quantum well layer having at least one bound energy state, and further having an Ec at approximately the same level as the Ecs of said first and second electrode layers, and an Ev at approximately the same level as the Evs of said first and second electrode layers, first and second barrier layers respectively between said second and first electrode layers and said quantum well layer and in contact with said quantum well layer, each barrier layer having an Ec greater than the Ecs of said quantum well and electrode layers, and an Ev greater than the Ev but less than the Ec of said quantum well layer, and a controller contacting at least one of said barrier layers to create a charge transfer junction with each contacted barrier layer that controls the flow of current between said electrodes.

14. An RTT as in claim 13, wherein the Evs of said first and second barrier layers are closer to the Ec than to the Ev of said well layer.

15. An RTT as in claim 13, wherein said quantum well layer comprises InAs with a thickness in the approximate range of 20–150 Angstroms.

16. An RTT as in claim 13, wherein said first and second barrier layers comprise $Al_{1-x}Ga_xSb$ with a thickness in the approximate range of 10–100 Angstroms.

17. An RTT as in claim 16, wherein X is in the approximate range of 0.4–0.6.

18. An RTT as in claim 13, wherein said controller contacts said first but not said second barrier layer.

19. An RTT as in claim 13, wherein said controller contacts both said first and second barrier layers.

20. An RTT as in claim 13, wherein said controller contacts said second but not said first barrier layer.

21. An RTT as in claim 13, wherein said controller comprises p-type AlGaSb.

22. An RTT as in claim 13, wherein said first and second electrode layers comprise InAs with thicknesses in the approximate ranges of 0.5–2.0 micrometers and 500–2000 Angstroms, respectively.

* * * * *